(12) United States Patent
Oshima

(10) Patent No.: US 7,112,460 B2
(45) Date of Patent: Sep. 26, 2006

(54) SEMICONDUCTOR LASER DEVICE, PRODUCTION METHOD THEREFOR, AND JIG FOR USE IN THE PRODUCTION METHOD

(75) Inventor: Noboru Oshima, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 272 days.

(21) Appl. No.: 10/731,081

(22) Filed: Dec. 8, 2003

(65) Prior Publication Data
US 2004/0113160 A1 Jun. 17, 2004

(30) Foreign Application Priority Data
Dec. 10, 2002 (JP) ............... 2002-358080

(51) Int. Cl.
*H01L 21/00* (2006.01)
(52) U.S. Cl. ............... 438/31; 372/43.01; 372/46.012; 372/46.013; 372/50.1; 372/49.01; 438/42; 438/27; 438/32; 438/29
(58) Field of Classification Search ............ 372/43.01, 372/50.1, 46.013, 49.01, 46.012; 257/21, 257/67–88; 438/29, 42
See application file for complete search history.

(56) References Cited

U.S. PATENT DOCUMENTS

| | | | | |
|---|---|---|---|---|
| 5,430,750 A | * | 7/1995 | Tanimoto et al. | 372/49.01 |
| 6,067,310 A | * | 5/2000 | Hashimoto et al. | 372/49.01 |
| 6,392,979 B1 | * | 5/2002 | Yamamoto et al. | 369/121 |
| 6,647,047 B1 | * | 11/2003 | Yokota | 372/49.01 |
| 6,703,254 B1 | * | 3/2004 | Saitoh et al. | 438/29 |
| 6,710,375 B1 | * | 3/2004 | Oshima | 257/88 |
| 2002/0115303 A1 | * | 8/2002 | Ohta et al. | 438/765 |
| 2003/0156614 A1 | * | 8/2003 | Ueda et al. | 372/49 |
| 2004/0228382 A1 | * | 11/2004 | Oshima | 372/49 |
| 2005/0190807 A1 | * | 9/2005 | Toyama | 372/49.01 |

FOREIGN PATENT DOCUMENTS

| | | |
|---|---|---|
| JP | 62-104093 | 5/1987 |
| JP | 01-289289 | 11/1989 |
| JP | 01-318270 | 12/1989 |
| JP | 06-112579 A | 4/1994 |
| JP | 08-097496 | 4/1996 |
| JP | 09-162496 | 6/1997 |
| JP | 11-121876 | 4/1999 |
| JP | 2001-094194 | 4/2001 |
| JP | 2003-198044 | 7/2003 |

OTHER PUBLICATIONS

Office Action mailed Mar. 17, 2006, for Chinese Patent Application No. 200310123320.8, two pages, and English translation, four pages.

* cited by examiner

*Primary Examiner*—Min Sun Harvey
*Assistant Examiner*—Delma R. Flores Ruiz
(74) *Attorney, Agent, or Firm*—Morrison & Foerster LLP

(57) ABSTRACT

A semiconductor laser device includes a semiconductor substrate on which a semiconductor thin film including an active layer is lamineted, a pair of electrodes respectively provided on opposite faces of the substrate, a light emitting surface defined on a side face of the substrate to which the active layer and an edge of at least one of the electrodes are exposed, and a protective film covering the light emitting surface. The protective film has a smaller thickness on the edge of the electrode than on the active layer. This arrangement makes it possible to suppress diffusion of an electrode material in the protective film and sufficiently protect the light emitting surface.

8 Claims, 9 Drawing Sheets

SEMICONDUCTOR LASER DEVICE, PRODUCTION METHOD THEREFOR, AND JIG FOR USE IN THE PRODUCTION METHOD

CROSS-REFERENCE TO RELATED APPLICATIONS

This application is related to Japanese application No.2002-358080 filed on Dec. 10, 2002, whose priority is claimed under 35 USC § 119, the disclosure of which is incorporated by reference in its entirety.

BACKGROUND OF THE INVENTION

1. Field of the Invention

The present invention relates to a semiconductor laser device. More particularly, the invention relates to a structure of a protective film provided on a light emitting surface of a semiconductor laser device, a production method therefor, and a jig for use in the production method.

2. Description of the Related Art

Known as the prior art related to the present invention is a semiconductor laser device which has a protective film covering only a part of a light emitting surface including at least an active layer region but not entirely covering the light emitting surface.

Since the protective film covers only the part of the light emitting surface of the semiconductor laser device, a stress occurring in the protective film is reduced as compared with a case where the protective film entirely covers the light emitting surface. This reduces a damage to the active layer and prevents delamination of the protective film (see, for example, Japanese Unexamined Patent Publication No. 8-97496 (1996)).

The light emitting surface of the semiconductor laser device is liable to be oxidized by a laser beam emitted from the semiconductor laser device per se. The oxidation of the light emitting surface tends to adversely affect the reliability and service life of the semiconductor laser device.

For prevention of the oxidation of the light emitting surface, an oxide film such as of $Al_2O_3$ is formed as the protective film on the light emitting surface by vacuum vapor deposition.

In the formation of the $Al_2O_3$ protective film by the vapor deposition, however, the partial pressure of oxygen molecules generated by decomposition of the oxide material for the protective film is increased immediately after the start of the vapor deposition. The oxygen molecules generated by the decomposition during the vapor deposition impinge on the light emitting surface or are combined with the light emitting surface, thereby damaging the light emitting surface. Particularly, where the active layer of the semiconductor laser device and its peripheral layer contain aluminum, the damage is further exacerbated.

Therefore, it is a general practice to form an Si thin film on the light emitting surface by vapor deposition before the formation of the oxide protective film. The formation of the Si thin film has no possibility of generating oxygen due to the decomposition of the material in the vapor deposition.

Meanwhile, the semiconductor laser device includes a pair of gold electrodes provided on its front and back faces. In general, the front electrode is patterned into an asymmetric contour for discrimination between a major light emitting surface side and a rear side of the semiconductor laser device. On the other hand, the back electrode is generally provided on the entire back face of the semiconductor laser device in consideration of the labor and costs associated with the patterning.

In this case, an edge of the back electrode is exposed to the light emitting surface, so that the aforesaid Si thin film contacts the edge of the back electrode. With the Si thin film in contact with the back electrode, gold as the electrode material is diffused into the Si thin film by heat applied for the formation of the protective film by the vapor deposition. If gold is diffused into the Si thin film to reach the active layer region serving as a light emitting point of the semiconductor laser device, the maximum output of the semiconductor laser device is reduced to lower than half as compared with a case where the Si thin film is free from the diffusion of gold. This significantly reduces the reliability of the semiconductor laser device.

The diffusion of gold can be prevented, if the protective film is provided as partly covering the light emitting surface so as not to contact the edge of the back electrode. However, a protective film formation area limited to a part of the light emitting surface makes it difficult to sufficiently protect the light emitting surface.

SUMMARY OF THE INVENTION

In view of the foregoing, the present invention is directed to a semiconductor laser device including a protective film which is capable of suppressing diffusion of an electrode material and sufficiently protecting a light emitting surface.

According to the present invention, there is provided a semiconductor laser device which comprises: a semiconductor substrate on which a semiconductor thin film including an active layer is laminate; a pair of electrodes respectively provided on opposite faces of the substrate; a light emitting surface defined on a side face of the substrate to which the active layer and an edge of at least one of the electrodes are exposed; and a protective film covering the light emitting surface, the protective film having a smaller thickness on the edge of the electrode than on the active layer.

The diffusion of an electrode material in the protective film tends to be promoted as the thickness of the protective film is increased. Even with the protective film entirely covering the light emitting surface, the suppression of the diffusion of the electrode material and the sufficient protection of the light emitting surface can simultaneously be achieved, because the protective film has a smaller thickness on the edge of the electrode than on the active layer as described above.

DESCRIPTION OF THE PREFERRED EMBODIMENTS

Figure 1:
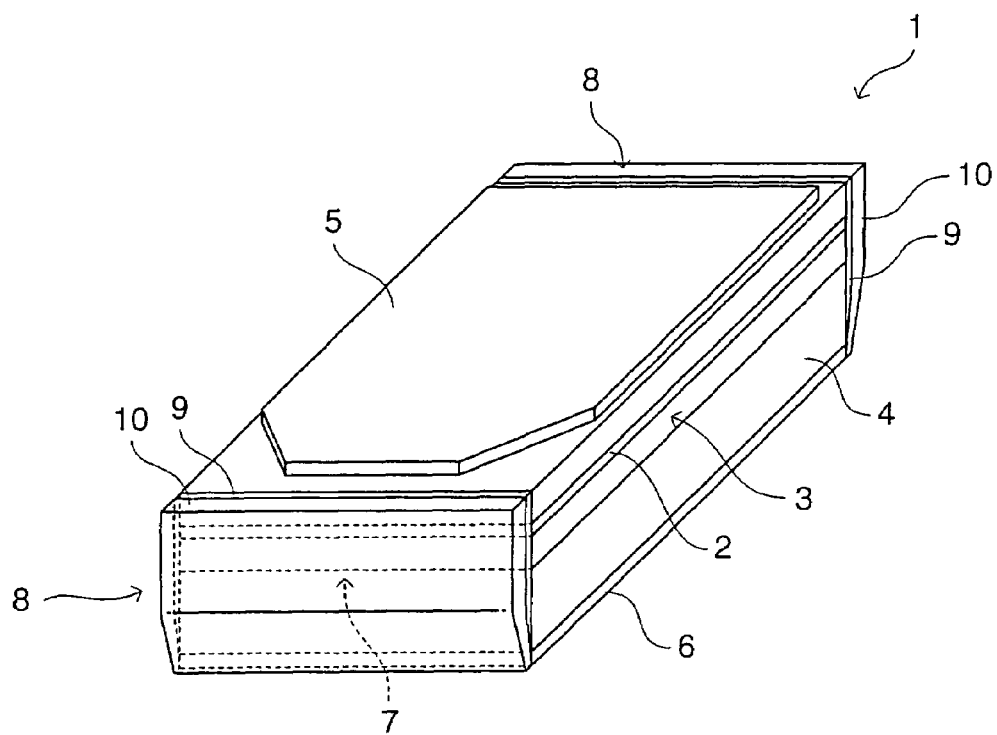
FIG. 1 is a perspective view of a semiconductor laser device according to a first embodiment of the present invention.

A semiconductor laser device according to the present invention comprises: a semiconductor substrate on which a semiconductor thin film including an active layer is laminated; a pair of electrodes respectively provided on opposite faces of the substrate; a light emitting surface defined on a side face of the substrate to which the active layer and an edge of at least one of the electrodes are exposed; and a protective film covering the light emitting surface, the protective film having a smaller thickness on the edge of the electrode than on the active layer.

In the semiconductor laser device according to the present invention, the semiconductor thin film including the active layer has such a construction that the active layer is sandwiched between a p-type clad layer and an n-type clad layer. More specifically, the semiconductor thin film has such a construction that an active layer of GaAlAs is sandwiched between a p-type clad layer of GaAlAs and an n-type clad layer of GaAlAs.

The semiconductor substrate is, for example, a GaAs substrate. The protective film has a laminate structure, for example, comprising a layer composed of one of $Al_2O_3$, $SiO_2$ and $TiO_2$ and an Si layer. The pair of electrodes are composed, for example, of gold.

In the semiconductor laser device according to the present invention, the protective film may have a thickness which is progressively reduced toward the edge of the electrode from the active layer. With this arrangement, the thickness of the protective film is not steeply changed, so that the strength of the protective film is improved as compared with a case where only a portion of the protective film covering the edge of the electrode has a smaller thickness.

In the semiconductor laser device according to the present invention, the protective film may have a laminate structure comprising a layer composed of one of $Al_2O_3$, $SiO_2$ and $TiO_2$ and an Si layer which contacts the light emitting surface and has a smaller thickness on the edge of the electrode than on the active layer, and the electrodes may be composed of gold. In this case, the Si layer may have a thickness which is progressively reduced toward the edge of the electrode from the active layer.

With this arrangement, the Si layer contacts the light emitting surface, so that oxygen molecules generated due to decomposition of a material such as $Al_2O_3$, $SiO_2$ or $TiO_2$ during vapor deposition are prevented from impinging on the light emitting surface or being combined with the light emitting surface to damage the light emitting surface. Further, the Si layer has a smaller thickness on the edge of the electrode than on the active layer, so that the conventional problem of the diffusion of the electrode material (gold) in the Si thin film can be suppressed.

The layer composed of one of $Al_2O_3$, $SiO_2$ and $TiO_2$ may have a smaller thickness on the edge of the electrode than on the active layer, like the Si layer, or may be provided on the Si layer as having the uniform thickness. That is, where the protective film has the aforesaid multi-layer structure, the diffusion of the electrode material (gold) can be suppressed by reducing the thickness of at least a portion of the Si layer covering the edge of the electrode.

The portion of the Si layer covering the edge of the electrode preferably has a thickness of smaller than about 20 Å, more preferably smaller than about 10 Å, for suppression of the diffusion of the electrode material (gold). If the thickness of the Si layer portion is about 20 Å or more, the diffusion of the electrode material (gold) is promoted. Where the thickness of the Si layer portion is about 40 Å, for example, the diffusion reaches the active layer region in most cases. Where the thickness of the Si layer portion is about 20 Å, for example, the diffusion reaches the active layer region in some cases.

According to another aspect of the present invention, there is provided a method for producing the aforesaid inventive semiconductor laser device, which comprises the steps of: forming a pair of electrodes on opposite faces of a semiconductor substrate on which a semiconductor thin film including an active layer is laminated; defining a light emitting surface on a side face of the semiconductor substrate to which the active layer and an edge of at least one of the electrodes are exposed; and forming a protective film on the light emitting surface by vapor deposition; wherein the protective film forming step comprises the step of masking the edge of the electrode with a jig spaced a predetermined distance from the edge of the electrode so as to indirectly shield the edge of the electrode from a vapor deposition source during the vapor deposition, whereby the protective film is formed as having a smaller thickness on the edge of the electrode than on the active layer.

According to further another aspect of the present invention, there is provided a method for producing the aforesaid inventive semiconductor laser device, which comprises the steps of: providing a laser bar having light emitting surfaces respectively defined on opposite side faces thereof to which an active layer thereof and edges of electrodes thereof are exposed; forming protective films on the respective light emitting surfaces of the laser bar by vapor deposition; and dicing the laser bar formed with the protective films; wherein the protective film forming step comprises the step of masking the edges of the electrodes with a jig spaced a predetermined distance from the edges of the electrodes so as to indirectly shield the edges of the electrodes exposed to the light emitting surfaces of the laser bar from a vapor deposition source during the vapor deposition, whereby the protective films are formed as having a smaller thickness on the edges of the electrodes than on the active layer.

In the present invention, the term "laser bar" means a strip-shaped semiconductor substrate on which a semiconductor thin film including an active layer is laminated, and including plural pairs of electrodes provided on opposite faces thereof and light emitting surfaces defined on opposite side faces to which the active layer and edges of the electrodes are exposed.

In these production methods, the vapor deposition is performed, while the edges of the electrodes are masked with the jig spaced the predetermined distance from the edges of the electrodes. Therefore, a vapor deposition material slightly intrudes into spaces defined between the edges of the electrodes and the jig. Thus, the protective films are formed as entirely covering the light emitting surfaces and having a smaller thickness on the edges of the electrodes.

In the aforesaid production methods, portions of the light emitting surfaces masked with the jig are not limited to the edges of the electrodes, but may include any portions of the light emitting surfaces except portions of the light emitting surfaces to which the active layer is exposed.

Since the formation of the protective films on the edges of the electrodes is retarded, the vapor deposition material for the protective films does not reach the surfaces of the electrodes. Therefore, unwanted film formation on the surfaces of the electrodes can be prevented.

In the conventional semiconductor laser device production method, the vapor deposition material intrudes into small spaces defined between opposed electrodes of semiconductor laser devices stacked one on another during the vapor deposition, so that the protective films may also be formed on the surfaces of the electrodes. The formation of the protective films on the surfaces of the electrodes makes it difficult to bond the semiconductor laser device to a die such as a heat sink, or makes it impossible to bond wires to the surfaces of the electrodes thereby to cause an electrical connection failure in the assembly of the semiconductor laser device. Therefore, unnecessary portions of the protective films formed on the surfaces of the electrodes should be removed after the formation of the protective films in the conventional semiconductor laser device production method. On the contrary, the aforesaid inventive production methods obviate such an operation.

In the aforesaid inventive production methods, the predetermined distance may be about 25 to 40 μm. If the distance is smaller than about 25 μm, there is a higher possibility that the light emitting surfaces are damaged by the jig in the step of masking the edges of the electrodes with the jig. If the distance is greater than 40 μm, it is impossible to sufficiently shield the edges of the electrodes from the vapor deposition.

In the aforesaid inventive production methods, the protective films may each have a laminate structure comprising a layer composed of one of $Al_2O_3$, $SiO_2$ and $TiO_2$ and an Si layer. In this case, the Si layer may be formed by vapor deposition while the edges of the electrodes are masked with the jig. With this arrangement, the formation of the Si layer which has no possibility of generating oxygen molecules due to decomposition of a material during the vapor deposition precedes the formation of the layer composed of $Al_2O_3$, $SiO_2$ or $TiO_2$, so that the light emitting surfaces can be prevented from being damaged during the formation of the protective film by the vapor deposition.

Further, the edges of the electrodes are masked with the jig during the vapor deposition for the formation of the Si film. Therefore, at least the Si film has a smaller thickness on the edges of the electrodes, so that the diffusion of the electrode material is suppressed.

According to still another aspect of the present invention, there is provided a jig for use in either of the aforesaid inventive production methods, which comprises: a base on which a semiconductor substrate or a laser bar is to be placed with its electrode opposed to the base; a shield member projecting upright from an edge of the base for masking an edge of the electrode exposed to a light emitting surface of the semiconductor substrate or the laser bar; wherein, when the semiconductor substrate or the laser bar is placed on the base, the shield member is spaced a predetermined distance from the edge of the electrode of the semiconductor substrate or the laser bar.

In the aforesaid inventive jig, the predetermined distance may be about 25 to 40 μm. If the distance is smaller than about 25 μm, the semiconductor substrate or the laser bar cannot easily be mounted on the jig, so that the light emitting surface of the semiconductor substrate or the laser bar may be damaged. If the distance is greater than 40 μm, the edge of the electrode cannot sufficiently be shielded from the vapor deposition. As a result, a greater amount of the vapor deposition material intrudes into a space defined between the shield member and the edge of the electrode, so that the vapor deposition material is deposited on the edge of the electrode to a thickness greater than a desired thickness. The desired thickness is herein smaller than about 20 Å.

In the aforesaid inventive jig, the shield member has a height such that an upper edge thereof is located at a level lower than an active layer of the semiconductor substrate or the laser bar exposed to the light emitting surface when the semiconductor substrate or the laser bar is placed on the base. With this arrangement, a portion of the semiconductor substrate or the laser bar required to be shielded from the vapor deposition can assuredly be shielded, while a portion of the semiconductor substrate or the laser bar not to be shielded (i.e., the active layer exposed to the light emitting surface) can assuredly be exposed to the vapor deposition source.

In the aforesaid inventive jig, the base may be rectangular, and the shield member may include two shield members which respectively project upright from opposite edges of the base in opposed relation. With this arrangement, the two shield members respectively projecting upright from the opposite edges of the rectangular base make it easy to position the semiconductor substrate or the laser bar on the base. As a result, opposite edges of the electrode can be spaced the predetermined distance from the shield members with an improved accuracy.

Semiconductor laser devices according to embodiments of the present invention will hereinafter be described in detail with reference to the attached drawings. In the following embodiments, like components will be denoted by like reference characters.

First Embodiment

Figure 2:
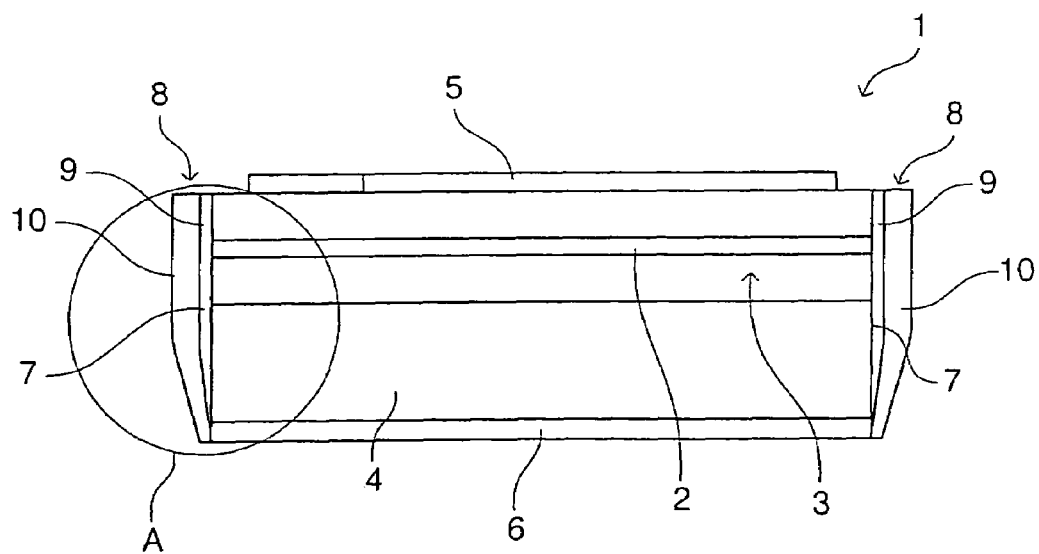
FIG. 2 is a side view of the semiconductor laser device shown in FIG. 1.
Figure 3:
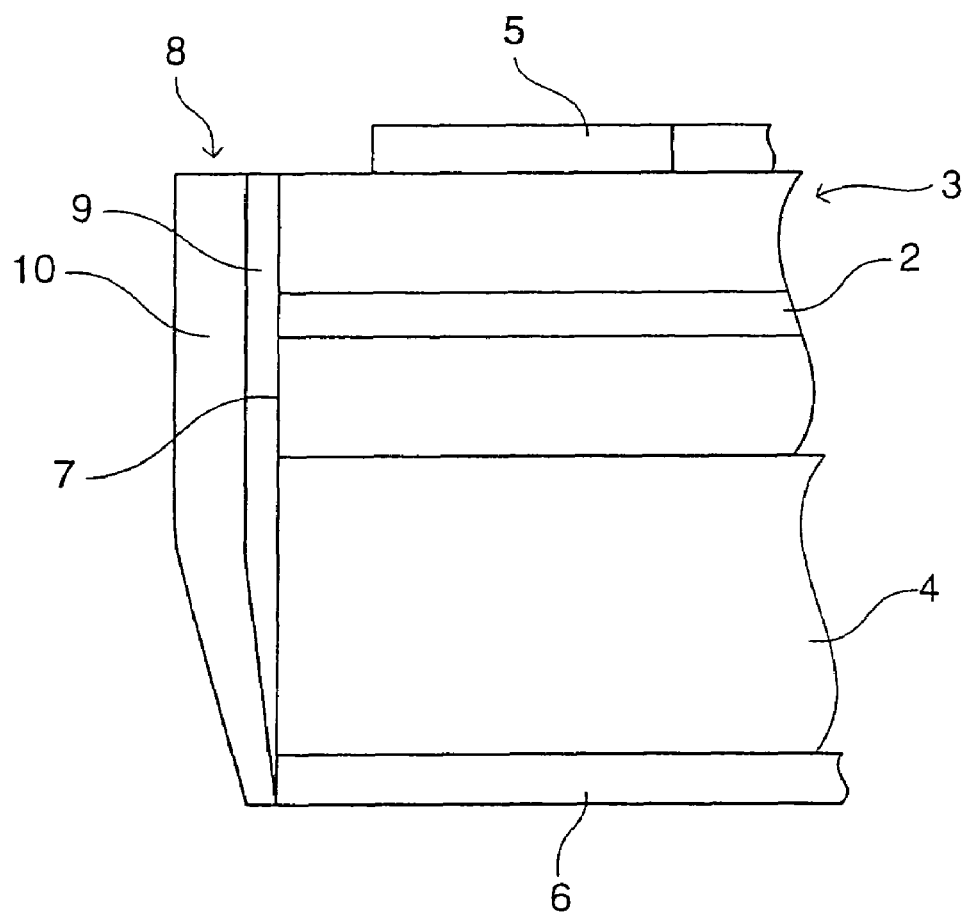
FIG. 3 is an enlarged view of a portion A shown in FIG. 2.

A semiconductor laser device according to a first embodiment of the present invention will be described with reference to FIGS. 1 to 3. FIG. 1 is a perspective view illustrating the overall construction of the semiconductor laser device according to the first embodiment, and FIG. 2 is a side view of the semiconductor laser device shown in FIG. 1. FIG. 3 is an enlarged view of a portion A shown in FIG. 2.

As shown in FIGS. 1 to 3, the semiconductor laser device 1 according to the first embodiment includes a semiconductor substrate 4 on which a semiconductor thin film 3 including an active layer 2 is laminated, a front electrode 5 and a back electrode 6 respectively provided on opposite faces of the semiconductor substrate 4, light emitting surfaces 7 respectively defined on opposite side faces of the semiconductor substrate 4 to which the active layer 2 and opposite edges of the back electrode 6 are exposed, and protective films 8 respectively covering the light emitting surfaces 7. The protective films 8 have a smaller thickness on the edges of the back electrode 6 than on the active layer 2.

The protective films 8 each have a laminate structure including an Si film 9 and an $Al_2O_3$ film 10, and have a predetermined reflection coefficient. The front electrode 5 and the back electrode 6 are composed of gold.

Next, a production method for the semiconductor laser device 1 shown in FIGS. 1 to 3 will be described with reference to FIGS. 4(a) to 9.

Figure 4A:
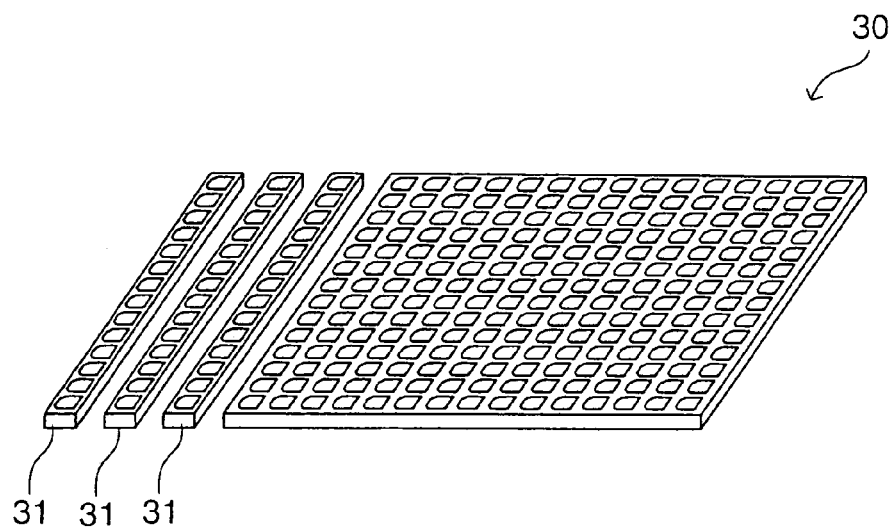
FIGS. 4(a), 4(b), 5(c), 6(a) to 6(d) and 7(e) are diagrams for explaining a production process for the semiconductor laser device according to the first embodiment.

First, as shown in FIG. 4(a), a laser wafer 30 is diced along predetermined lines into a plurality of strip-shaped laser bars 31. The laser bars 31 each include a set of semiconductor laser devices 1 which are not yet formed with protective films 8 (see FIGS. 1 to 3) but already each formed with a front electrode 5 and a back electrode (not shown) on front and back faces thereof, respectively.

Figure 4B:
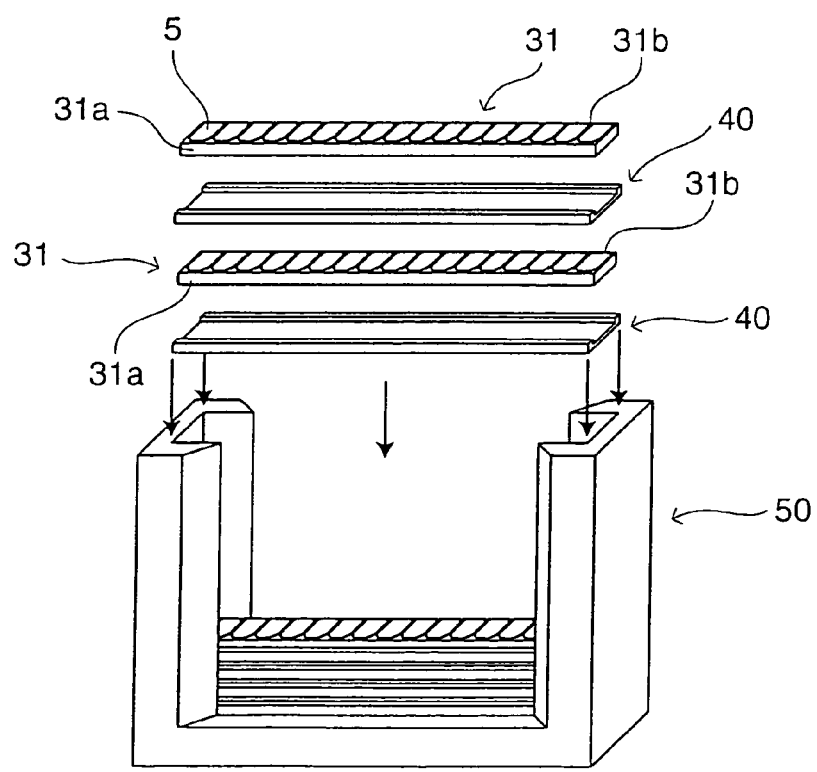
Figure 8:
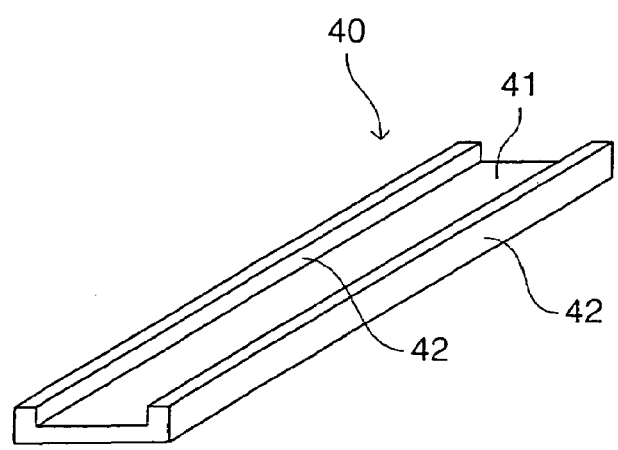
FIG. 8 is a perspective view of a jig for use in the production process for the semiconductor laser device according to the first embodiment.

Next, as shown in FIG. 4(b), the laser bars 31 are respectively mounted on film formation jigs 40 as shown in FIG. 8 and accommodated in a holder 50. Thus, the film formation jigs 40 and the laser bars 31 are accommodated in alternately stacked relation in the holder 50. Anterior side faces 31a and posterior side faces 31b of the respective laser bars 31 are oriented in the same directions, when the laser bars 31 are accommodated in the holder 50.

Figure 9:
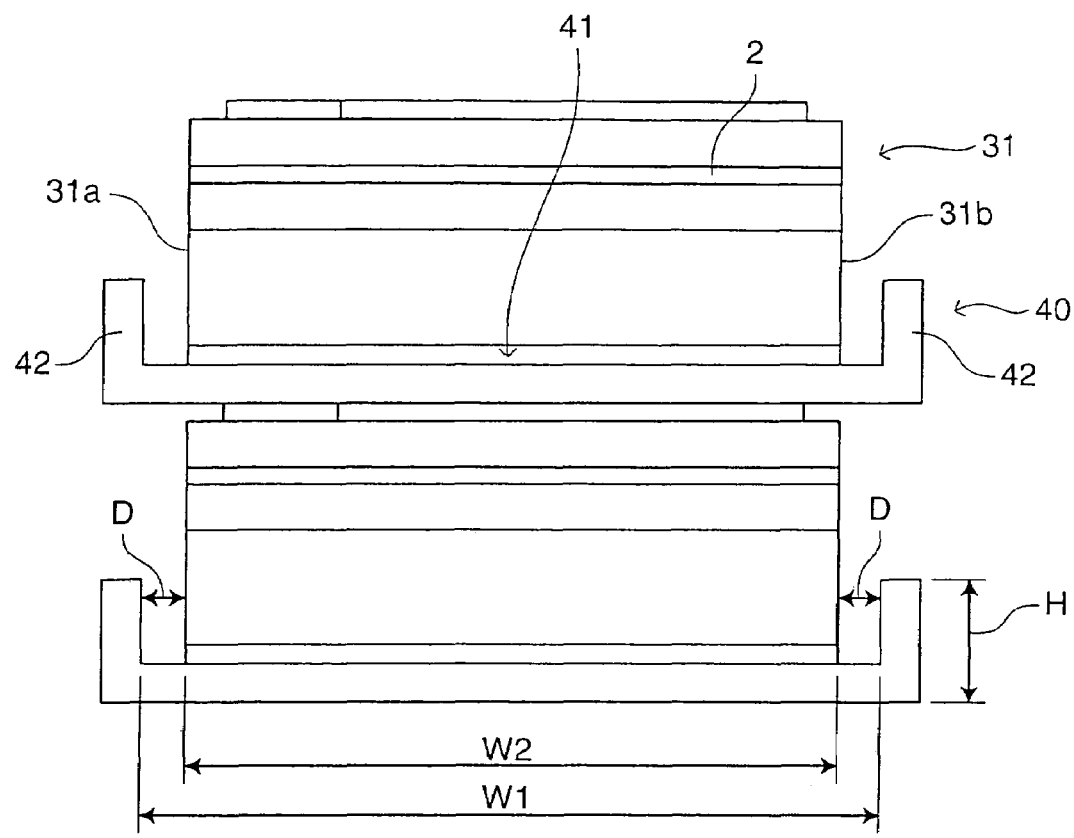
FIG. 9 is an explanatory diagram illustrating laser bars mounted on jigs shown in FIG. 8 and accommodated in stacked relation in a holder.

As shown in FIG. 8, the film formation jigs 40 each include a rectangular flat portion (base) 41 on which the laser bar 31 is to be placed, and walls (shield members) 42 projecting upright from opposite edges of the flat portion 41. A positional relationship between the laser bars 31 and the film formation jigs 40 accommodated in the holder 50 is shown in FIG. 9.

More specifically, with the laser bar 31 placed on the flat portion 41 of the film formation jig 40, the anterior side face 31a and posterior side face 31b of the laser bar 31 are respectively spaced a distance D of about 25 to 40 μm from the walls 42 of the film formation jig 40. That is, the width W1 of the flat portion 41 of the film formation jig 40 is set at a value which is calculated by adding about 50 to 80 μm to the width W2 of the laser bar 31 as measured from the anterior side face 31a to the posterior side face 31b.

The height H of the walls 42 is determined so that upper edges of the walls 42 are located at a level lower than the active layer 2 exposed to the side faces of the laser bar 31 when the laser bar 31 is mounted on the film formation jig 40.

Figure 5C:
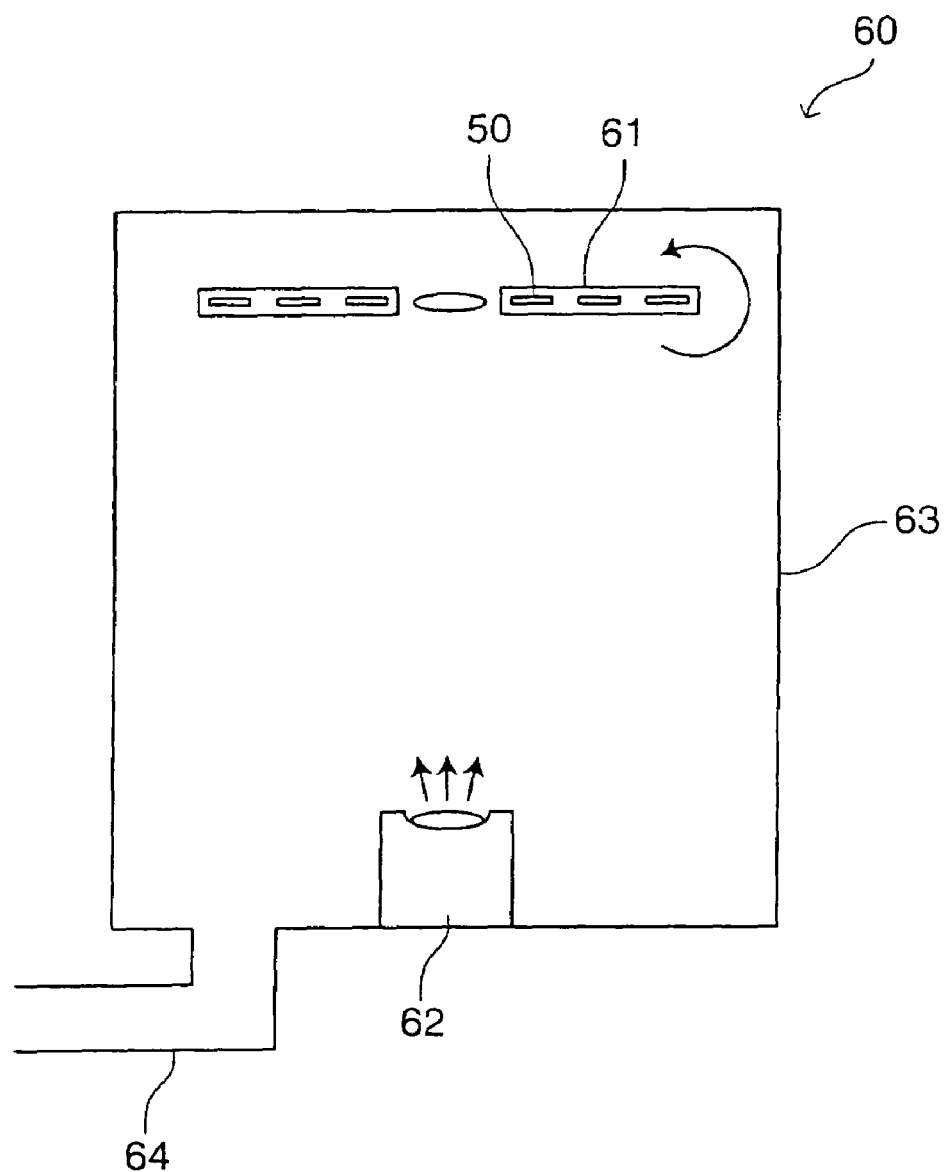

Subsequently, as shown in FIG. 5(c), the holder 50 in which the laser bars 31 and the film formation jigs 40 are accommodated is mounted in a rotary holder 61 in a vacuum vapor deposition apparatus 60. At this times the anterior side faces 31a of the laser bars 31 accommodated in the holder 50 (see FIG. 4(b)) are opposed to a vapor deposition source 62 in the vacuum vapor deposition apparatus 60.

After the holder 50 is mounted in the rotary holder 61, a chamber 63 of the vacuum vapor deposition apparatus 60 is evacuated through a duct 64. When a predetermined vacuum degree is reached, a vapor deposition material is evaporated from the vapor deposition source 62 to start film formation.

Now, a process for the film formation will be described more specifically with reference to FIGS. 6(a) to 6(d) and 7(e). In FIGS. 6(a) to 6(d) and 7(e), only the laser bar is shown, and the film formation jig and the holder are not shown.

Figure 6A:
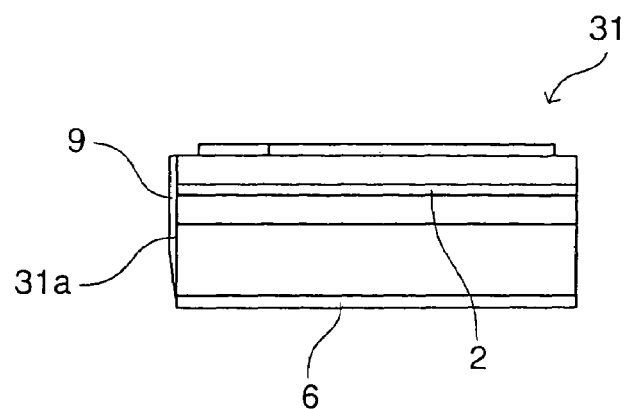

First, as shown in FIG. 6(a), an Si film 9 is formed at a film formation rate of about 1 Å/sec on the anterior side face 31a of the laser bar 31. When the thickness of a portion of the Si film covering the active layer 2 reaches about 20 Å, the film formation is completed.

At this time, the edge of the back electrode 6 exposed to the anterior side face 31a of the laser bar 31 and its periphery are masked with the wall 42 of the film formation jig 40 spaced from the anterior side face 31a (see FIG. 9) thereby to be indirectly shielded from the vapor deposition source (see FIG. 5(c)). Thus, the film formation on the edge of the back electrode 6 and its periphery is retarded, so that the Si film 9 has a thickness of not greater than 10 Å on the edge of the back electrode 6. The retardation of the film formation on the edge of the back electrode 6 prevents the vapor deposition material from reaching at least the surface of the back electrode 6, so that unwanted film formation on the surface of the back electrode 6 is avoided.

Figure 6B:
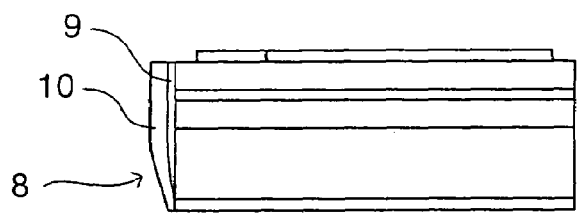

Next, as shown in FIG. 6(b), an $Al_2O_3$ film 10 is formed at a film formation rate of about 30 Å/sec on the Si film 9. When the thickness of a portion of the $Al_2O_3$ film covering the active layer 2 reaches about 500 to 1000 Å, the film formation is completed. As a result, the protective film 8 including the Si film 9 and the $Al_2O_3$ film 10 is provided.

In the formation of the $Al_2O_3$ film 10, the edge of the back electrode 6 and its periphery are indirectly shielded from a vapor deposition source by the wall 42 of the film formation jig 40, so that the film formation on the edge of the back electrode 6 and its periphery is retarded as in the formation of the Si film 9. Thus, the $Al_2O_3$ film has a thickness of not greater than about 100 Å on the edge of the back electrode 6.

After the protective films 8 are thus formed on the anterior side faces 31a of the laser bars 31, the rotary holder 61 of the vacuum vapor deposition apparatus (see FIG. 5(c)) is pivoted to bring the posterior side faces 31b of the laser bars 31 (see FIG. 4(b)) into opposed relation to the vapor deposition source 62.

Figure 6C:
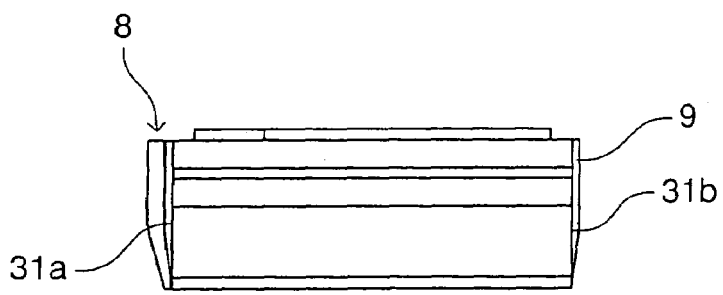
Figure 6D:
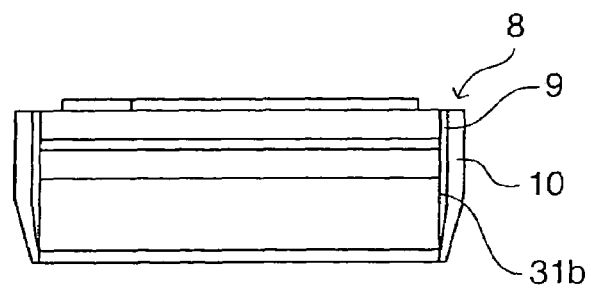

Subsequently, as shown in FIGS. 6(c) and 6(d), an Si film 9 and an $Al_2O_3$ film 10 are formed on the posterior side face 31b of each of the laser bars 31 for formation of a protective film 8 on the posterior side face 31b in the same manner as in the formation of the protective film 8 on the anterior side face 31a.

Then, the holder 50 is taken out of the rotary holder 61 of the vacuum vapor deposition apparatus 60 (see FIG. 5(c)), and the laser bars 31 each having the protective films 8 provided on the anterior and posterior side faces 31a, 31b thereof are taken out of the holder 50 (see FIG. 4(b)).

Figure 7E:
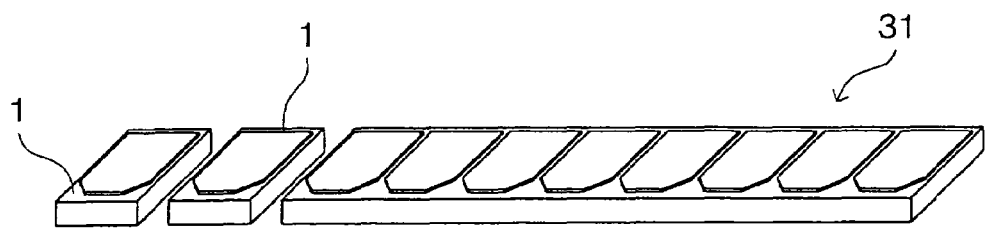

Thereafter, as shown in FIG. 7(e), the laser bars 31 thus taken out are each diced along predetermined lines into a plurality of semiconductor laser devices 1.

In the semiconductor laser device 1 thus produced, portions of the Si films 9 covering the edges of the back electrode 6 are very thin with a thickness of not greater than about 10 Å. Therefore, gold constituting the back electrode 6 is not diffused into the Si films 9, even if the back electrode 6 is heated when the $Al_2O_3$ films 10 are formed.

Further, the protective films 8 are formed as entirely covering the light emitting surfaces 7. Therefore, the light emitting surfaces 7 are sufficiently protected. Particularly, the Si film portions and the $Al_2O_3$ film portions of the protective films 8 covering the active layer 2 respectively have the predetermined thicknesses, so that the active layer 2 is sufficiently protected.

Since the Si film 9 is interposed between the light emitting surface 7 and the $Al_2O_3$ film 10, the reflection coefficient of the protective film 8 may be changed as compared with a protective film consisting of an $Al_2O_3$ film alone. However, the thickness of the Si film 9 is about 20 Å, so that the provision of the Si film 9 hardly influences the reflection coefficient of the protective film 8. The reflection coefficient of the protective film 8, even if changed, can be adjusted to a desired level by properly controlling the thickness of the $Al_2O_3$ film 10.

Figure 10:
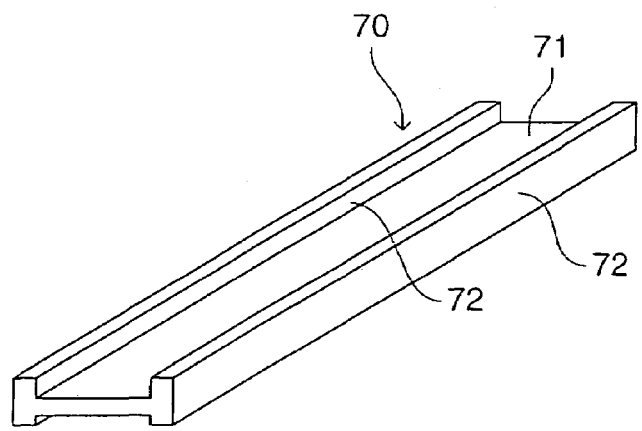
FIG. 10 is a perspective view illustrating another jig for use in the production process for the semiconductor laser device according to the present invention.
Figure 12:
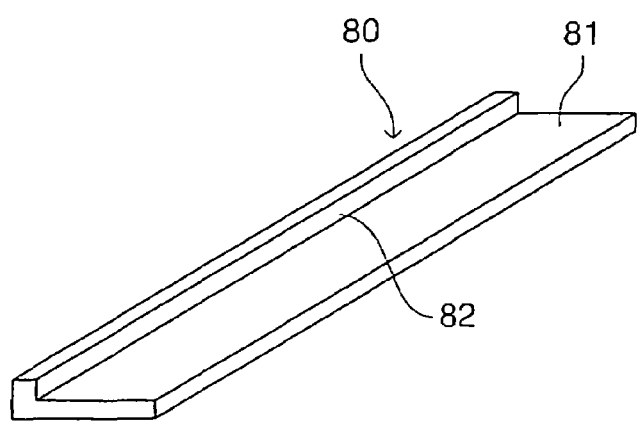
FIG. 12 is a perspective view illustrating further another jig for use in the production process for the semiconductor laser device according to the present invention.

The construction of the film formation jig 40 is not limited to that shown in FIG. 8, but may be that shown in FIG. 10 or 12.

Figure 11:
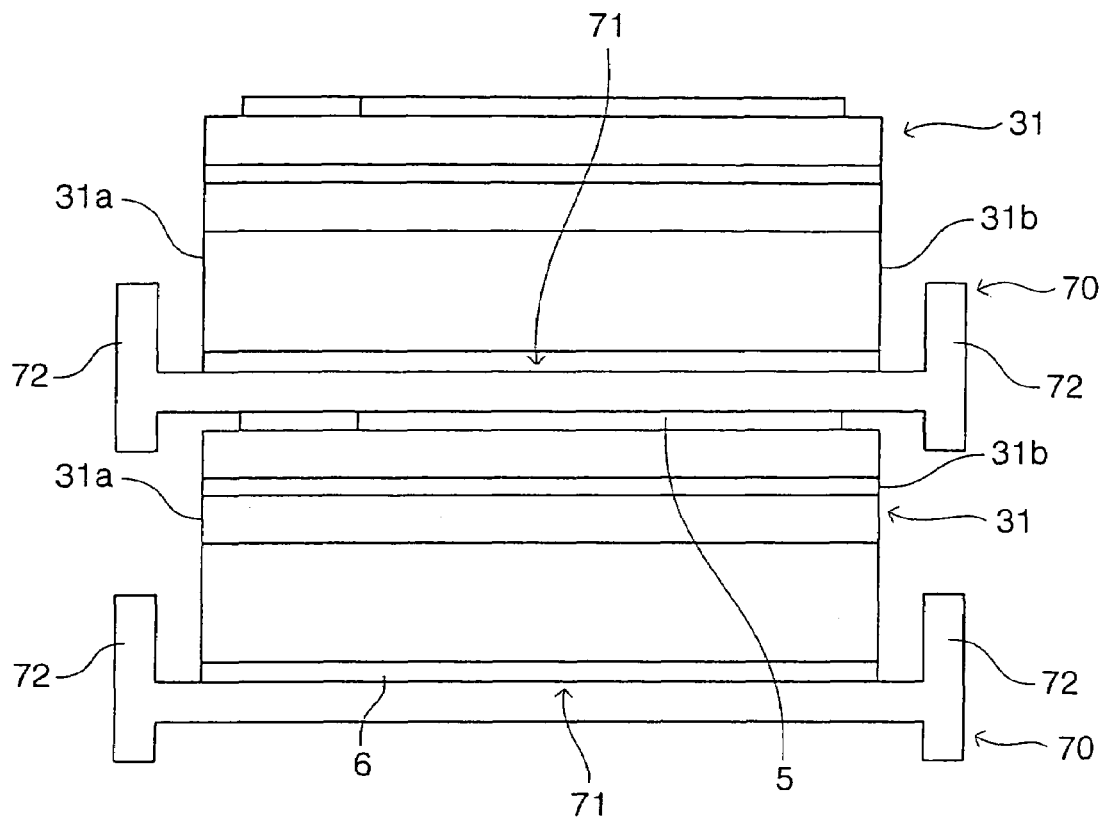
FIG. 11 is an explanatory diagram illustrating laser bars mounted on jigs shown in FIG. 10 and accommodated in stacked relation in a holder.

A film formation jig 70 shown in FIG. 10 is constructed such that walls thereof project from the opposite edges of a flat portion 71 thereof not only toward the front side but also toward the back side. Laser bars 31 are respectively mounted on film formation jigs 70 each having the aforesaid construction, and accommodated in stacked relation in the holder 50. A positional relationship between the laser bars 31 and the film formation jigs 70 in the holder 50 is shown in FIG. 11.

As described above, the walls 72 of the film formation jig 70 project from the flat portion 71 toward the back side as well, so that the edges of the front and back electrodes on the anterior and posterior side faces 31a, 31b of the laser bar 31 are masked with the walls 72 spaced from the edges of the front and back electrodes.

Therefore, even where the edges of the front electrode 5 and the back electrode 6 are exposed to the light emitting surfaces 7, the electrode material (gold) can be prevented from being diffused into the Si films 9, because the Si films 9 (see FIG. 6(a)) have a smaller thickness on the edges of the front electrode 5 and the back electrode 6.

Further, the vapor deposition materials for the protective films 8 are not deposited on the surfaces of the front electrode 5 and the back electrode 6. This obviates the need for removing unnecessary film portions formed on the electrodes.

Figure 13:
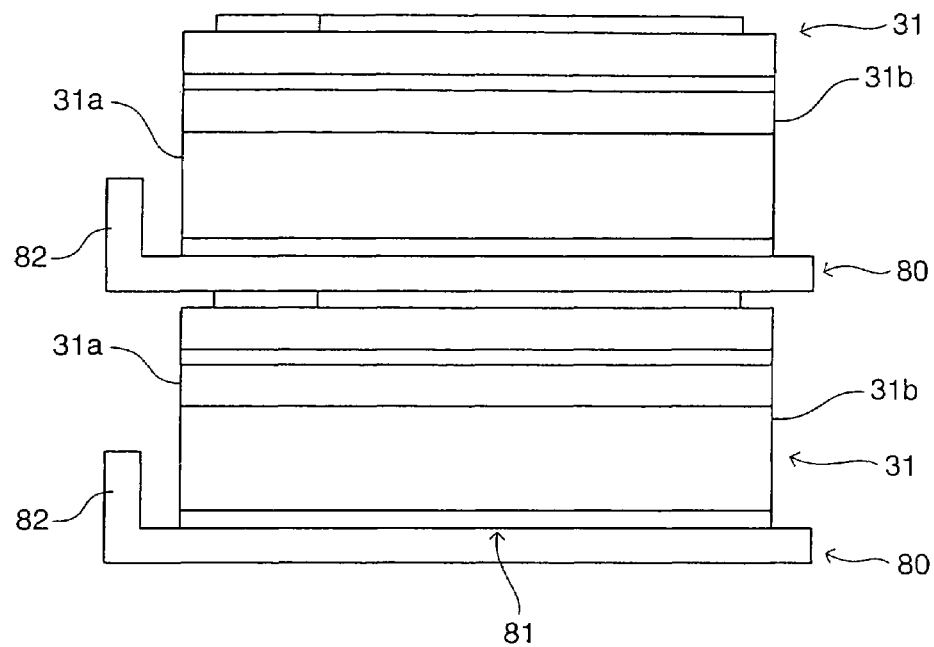
FIG. 13 is an explanatory diagram illustrating laser bars mounted on jigs shown in FIG. 12 and accommodated in stacked relation in a holder.

A film formation jig 80 shown in FIG. 12 is constructed such that a wall 82 thereof projects upright only from one of opposite edges of a flat portion 81 thereof. Laser bars 31 are respectively mounted on film formation jigs 80 each having the aforesaid construction, and accommodated in stacked relation in the holder 50. A positional relationship between the laser bars 31 and the film formation jigs 80 in the holder 50 is shown in FIG. 13.

The film formation jig 80 is employed for formation of an Si film 9 (see FIG. 6(a)) on either of the anterior side face 31a and the posterior side face 31b of the laser bar 31.

Second Embodiment

Figure 14:
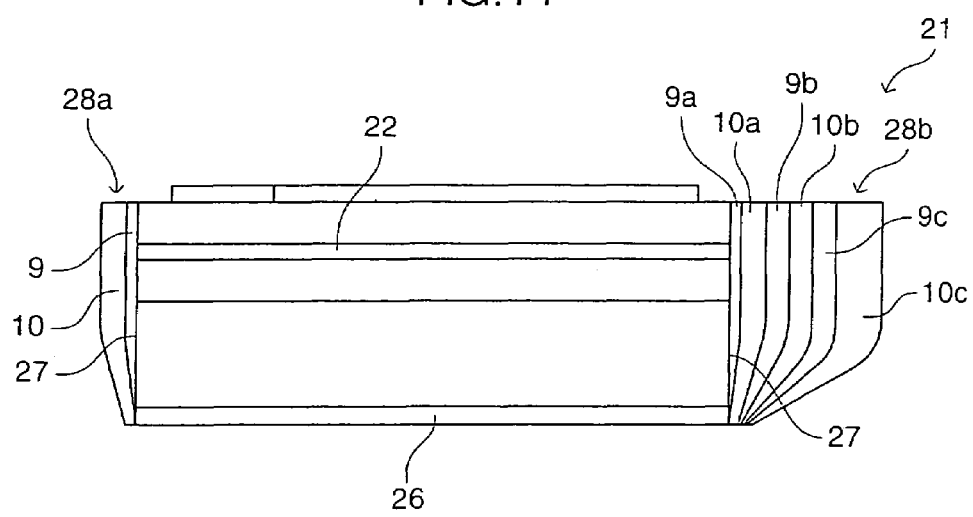
FIG. 14 is a side view of a semiconductor laser device according to a second embodiment of the present invention.

A semiconductor laser device according to a second embodiment of the present invention will be described with reference to FIG. 14. FIG. 14 is a side view of the semiconductor laser device according to the second embodiment.

The semiconductor laser device 21 according to the second embodiment includes protective films 28a, 28b respectively provided on light emitting surfaces 27 defined on opposite side faces thereof. Of these protective films, the protective film 28a provided on an anterior side face of the semiconductor laser device 21 is a lower reflectivity film, and the protective film 28b provided on a posterior side face of the semiconductor laser device 21 is a higher reflectivity film. Thus, the output of light emitted from the anterior side face is improved. The semiconductor laser device 21 has substantially the same construction as the semiconductor laser device 1 (see FIGS. 1 to 3) according to the first embodiment except for the arrangement of the protective films 28a, 28b.

The protective film 28a on the anterior side face has a reflection coefficient of not higher than about 15%, while the protective film 28b on the posterior side face has a reflection coefficient of not lower than about 85%.

The protective film 28a on the anterior side face includes an about 20 Å-thick Si film 9 and an about 700 Å- to 1600 Å-thick $Al_2O_3$ film 10 stacked in this order on the light emitting surface 27. On the other hand, the protective film 28b on the posterior side face includes an about 20 Å-thick Si film 9a, an about 1950 Å-thick $Al_2O_3$ film 10a, an about 1950 Å-thick Si film 9b, an about 1950 Å-thick $Al_2O_3$ film 10b, an about 1950 Å-thick Si film 9c, and an about 3900 Å-thick $Al_2O_3$ film 10c stacked in this order on the light emitting surface 27. The thicknesses of the respective films of the protective films 28a, 28b are herein defined as measured on the active layer 22.

The thicknesses of the respective films of the protective films 28a, 28b are calculated on the assumption that the oscillation wavelength ($\lambda$) is about 7800 Å, the refractive index (n) of the $Al_2O_3$ films is about 1.60, and the refractive index (n) of the semiconductor laser device 21 is about 3.50. The formation of the respective films of the protective films 28a, 28b is achieved in substantially the same manner as in the first embodiment, so that the Si films 9, 9a have a smaller thickness on the edges of the back electrode 26 than on the active layer 22. Thus, gold as the material for the back electrode 26 is prevented from being diffused into the Si films 9, 9a.

According to the present invention, the protective film has a smaller thickness on the edge of the electrode than on the active layer, thereby making it possible to suppress the diffusion of the electrode material and sufficiently protect the light emitting surface.

What is claimed is:

1. A method for producing a semiconductor laser device, the method comprising the steps of:

forming a first and a second electrode on opposite faces of the semiconductor substrate on which a semiconductor thin film including the active layer is laminated;

defining a light emitting surface on a side face of the semiconductor substrate to which the active layer and an edge of at least one of the electrodes is exposed; and forming a protective film on the light emitting surface by vapor deposition;

wherein the protective film forming step comprises the step of masking the edge of the at least one of the electrodes with a jig spaced a predetermined distance from the edge of the at least one of the electrodes so as to indirectly shield the edge of the at least one of the electrodes from a vapor deposition source during the vapor deposition, whereby the protective film is formed as having a smaller thickness on the edge of the at least one of the electrodes than on the active layer.

2. A method for producing a semiconductor laser device the method comprising the steps of:

providing a laser bar having light emitting surfaces respectively defined on opposite side faces thereof to which an active layer thereof and an edge of at least one electrode thereof is exposed;

forming a protective film on the respective light emitting surfaces of the laser bar by vapor deposition; and dicing the laser bar formed with the protective film;

wherein the protective film forming step comprises the step of masking the edge of the at least one electrode with a jig spaced a predetermined distance from the edge of the at least one electrode so as to indirectly shield the edge of the of the at least one electrode exposed to the light emitting surfaces of the laser bar from a vapor deposition source during the vapor deposition, whereby the protective film is formed as having a smaller thickness on the edge of the at least one electrode than on the active layer.

3. A method as set forth in claim 2, wherein the predetermined distance is 25 to 40 µm.

4. A method as set forth in claim 2, wherein the protective film has a laminate structure comprising a layer composed of one of $Al_2O_3$, $SiO_2$ and $TiO_2$ and an Si layer, the Si layer being formed by vapor deposition while the edge of the at least one electrode are masked with the jig.

5. A method as recited in claim 2, wherein the jig used to mask the edge of the at least one electrode, the jig comprising:
a base on which a laser bar is to be placed with the at least one electrode opposed to the base; and
a shield member projecting upright from an edge of the base for masking the edge of the at least one electrode exposed to a light emitting surface of the laser bar;
wherein, when the laser bar is placed on the base, the shield member is spaced a predetermined distance from the edge of the at least one electrode of the laser bar.

6. A method according to claim 5, wherein the predetermined distance is 25 to 40 μm.

7. A method according to claim 5, wherein the shield member has a height such that an upper edge thereof is located at a level lower than an active layer of the laser bar exposed to the light emitting surface when the laser bar is placed on the base.

8. A method according to claim 5, wherein the base is rectangular, and the shield member includes two shield members which respectively project upright from opposite edges of the base in opposed relation.

* * * * *